Figure 1:
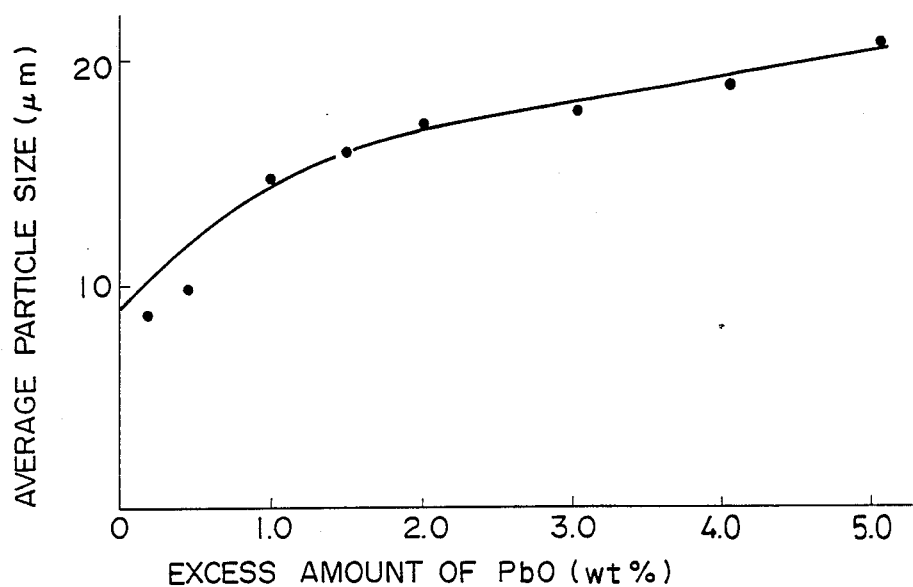

United States Patent [19]
Ozeki et al.

[11] Patent Number: 4,743,392
[45] Date of Patent: May 10, 1988

[54] PIEZOELECTRIC COMPOSITE MATERIAL

[75] Inventors: Hirofumi Ozeki; Hideo Sobue, both of Nagoya, Japan

[73] Assignee: NGK Spark Plug Co., Ltd., Japan

[21] Appl. No.: 894,312

[22] Filed: Aug. 7, 1986

[30] Foreign Application Priority Data

Aug. 7, 1986 [JP] Japan .................................. 60-174617

[51] Int. Cl.$^4$ ............................................. C04B 35/00
[52] U.S. Cl. .................................. 252/62.9; 252/520; 524/413
[58] Field of Search ............... 252/520, 62.9; 501/134; 524/401, 413

[56] References Cited

U.S. PATENT DOCUMENTS 4,595,515 6/1986 Wakimo et al. ..................... 252/520

Primary Examiner—Josephine Barr
Attorney, Agent, or Firm—Darby & Darby

[57] ABSTRACT

A piezoelectric ceramic composite material useful for use in underwater transducers or hydrophones, including an elastic organic matrix, and piezoelectric ceramic powder dispersed in the matrix and having the following chemical formula:

$$Pb_{1+x}TiO_{3+x}$$

wherein x is a number greater than 0.

5 Claims, 3 Drawing Sheets

PIEZOELECTRIC COMPOSITE MATERIAL

This invention relates generally to a piezoelectric material and, more specifically, to a piezoelectric composite material suitable for use as a piezoelectric element of an underwater transducer or a hydrophone adapted to receive an acoustic wave or ultrasonic wave propagating in water media or to generate a sound or ultrasonic wave to water media.

Piezoelectric composites which are made of piezoelectric ceramic powder, such as lead titanate, dispersed in an organic matrix and which have a lower density as compared with single, sintered piezoelectric ceramics have a superior acoustic matching with water. Such composites also have a high flexibility and, therefore, are only sparingly influenced by a high hydraulic pressure. All the above properties of the piezoelectric composites allow the use thereof as piezoelectric elements of underwater transducers or hydrophones. Piezoelectric composite materials for use in hydrophones are desired to have a large piezoelectric charge constant $d_h$, a large piezoelectric stress constant $g_h$ and a high receiving sensitivity $M_v$.

It is, therefore, the prime object of the present invention to provide a piezoelectric composite material having large $d_h$ and $g_h$ and high $M_v$ and suitable for application to underwater transducers or hydrophones.

In accomplishing the above objects, the present invention provides a piezoelectric composite material comprising an organic matrix, and piezoelectric ceramic powder of the chemical formula:

$$Pb_{1+x}TiO_{3+x}$$

wherein x is a number greater than 0, dispersed in the matrix.

The piezoelectric ceramic powder used in the piezoelectric composite material is composed of PbO and $TiO_2$. It is important that the molar ratio of PbO to $TiO_2$ should be greater than 1:1 in order to prepare a piezoelectric composite having desired properties. Preferably, the molar ratio of PbO to $TiO_2$ is 1.0068:1 to 1.07:1.

The organic matrix or substrate into which the piezoelectric ceramic powder is dispersed, preferably homogeneously, may be an elastic matrix such as a synthetic rubber. Preferably, the organic matrix is a synthetic rubber such as a polychloroprene rubber.

The amount of the piezoelectric ceramic powder in the piezoelectric composite material is preferably in the range of 40 to 80% by volume. The piezoelectric composite may further contain any suitable additive such as a vulcanizing agent. An amount of the ceramic powder below 40% by volume is generally insufficient to obtain a satisfactory sensitivity. On the other hand, too high a content of the ceramic powder causes difficulty in shaping or molding of the composite material.

The following examples and the accompanying drawings will further illustrate the present invention. In the drawings:

FIG. 1 is a graph showing the relationship between the amount of PbO and the average particle size of the piezoelectric ceramic powder used for the purpose of the present invention; and FIGS. 2—6 are graphs showing the relationship between the average particle size and piezoelectric charge constant $d_h$, piezoelectric stress constant $g_h$, receiving sensitivity $M_v$, dielectric loss tan δ and figure or merit $(d_h \times g_h)/\tan\delta$, respectively.

EXAMPLES 1-7

Preparation of Piezoelectric Ceramic Powder:

PbO powder having an average particle size of 3 μm or less and $TiO_2$ powder having an average particle size of 2 μm or less were mixed with various mixing ratios providing $Pb_{1+x}TiO_{3+x}$ where x is 0.0068 (Example 1), 0.014 (Example 2), 0.021 (Example 3), 0.028 (Example 4), 0.042 (Example 5), 0.056 (Example 6), 0.07 (Example 7) and 0 (control). Each mixture (2.5 Kg) was then commingled by means of a vibrating mill containing 3.5 Kg of alumina balls for 3 hours under dry conditions. The vibration mill used had a pot whose inside wall was lined with an urethane resin to prevent the inclusion of impurities in the mixture. The resulting admixture was placed in a mold and pressed at a pressure of 345 Kg/cm² to obtain tablets having a diameter of 47 mm, a thickness of 5 mm and a density of 4.5 g/cm³. The tablets were then heat treated in a high alumina crucible at 1050° C. for 2 hours to effect solid phase reaction. The heated mass was then quenched with water in a vessel to give finely divided solid particles. To facilitate the pulverization, the content in the vessel was stirred by means of a propeller type stirrer for 5 hours or more. The resultant mixtue in the vessel was then allowed to pass through a 280 mesh sieve (pore size 53) μm), followed by dewatering and drying at 100° C. for 24 hours, whereby finely divided lead titanate powder having the above-described composition were obtained. The relationship between the excess amount of PbO in terms of wt % and the number x is shown in Table below.

| Example | Excess Amount of PbO (wt %)* | $Pb_{1+x}TiO_{3+x}$ |
|---|---|---|
| 1 | 0.5 | x = 0.0068 |
| 2 | 1.0 | x = 0.014 |
| 3 | 1.5 | x = 0.021 |
| 4 | 2.0 | x = 0.028 |
| 5 | 3.0 | x = 0.042 |
| 6 | 4.0 | x = 0.056 |
| 7 | 5.0 | x = 0.07 |
| Control | 0 | x = 0 |

*Excess amount of PbO = $\frac{M_1}{M_1 + M_2} \cdot x \ (\times 100\%)$ where $M_1$ and $M_2$ represent the molecular weight of PbO and $TiO_2$, respectively.

Preparation of Piezoelectric Composites

Figure 5:
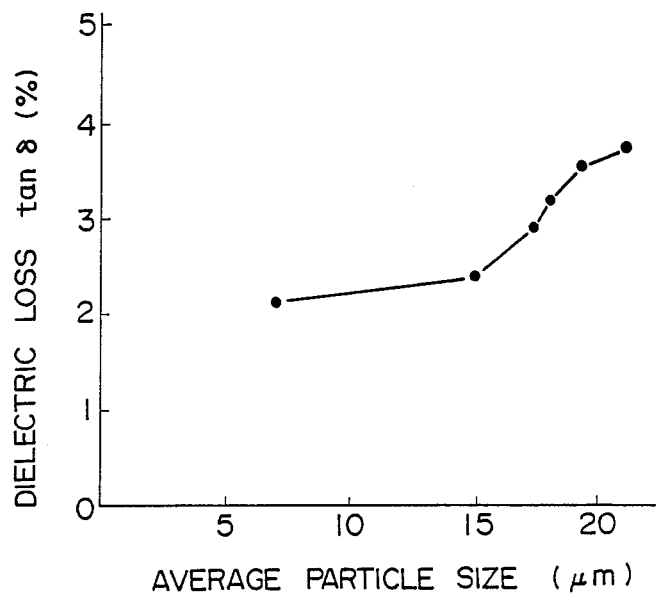
Figure 6:
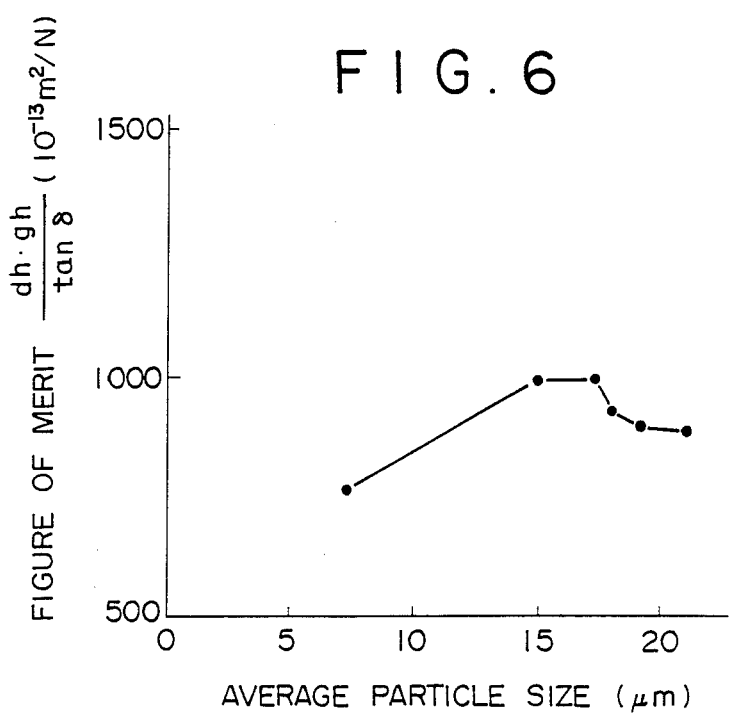

Each of the thus obtained piezoelectric ceramic powder (60 vol %) was mixed with a chloroprene rubber (40 vol %), with which was further mixed a vulcanizing agent composed of 20 parts by weight of $Pb_3O_4$, 5 parts by weight of ZnO and 0.5 part by weight of dibenzothiazolyl disulfide. The vulcanizing agent was used in an amount of 25.5 parts by weight per 100 parts by weight of the chloroprene rubber. The thus obtained compositions were each subjected to roll molding and then to a heat press treatment at a temperature of 180° C. and a pressure of 90 Kg/cm² for 20 minutes by means of a vulcanizing press machine, thereby to obtain piezoelectric composite sheets having a size of 150×150×2 mm. A silver paste was applied on both sides of each composite sheet to form rectangular electrodes. The resulting sheets were immersed in an insulating liquid and applied with a 100 KV/cm direct current voltage at 20° C. for 1 hour to effect poling. The resulting piezoelectric composite sheets were each used as a piezoelectric element of a hydrophone and tested for piezoelectric properties $d_h$, $g_h$ and $M_v$. The results are shown by way of graphs in FIGS. 2-4. Further, the electric loss tan δ and figure of merit $(d_h+g_h)/\tan\delta$ were calculated and are shown in FIGS. 5 and 6. The piezoelectric constants $d_h$ and $g_h$ were measured with a frequency of 40 Hz and the receiving sensitivity $M_v$ was determined on the basis that 0 dB = 1 V/bar. The measurement of these physical properties was conducted after allowing the sample to stand for 100 days from the poling treatment.

Figure 2:
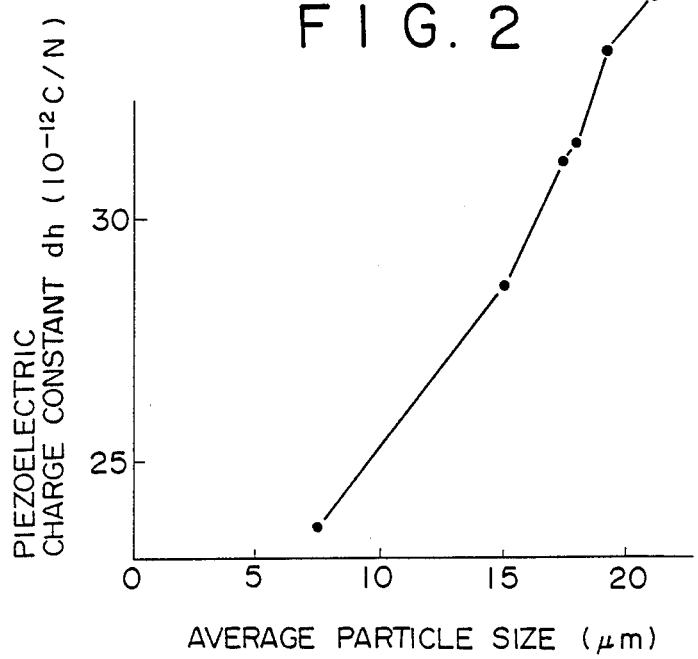
Figure 3:
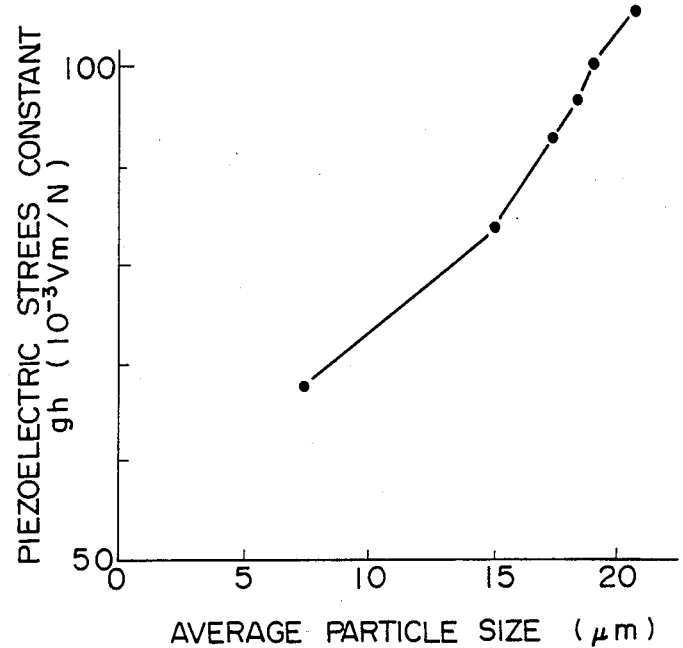
Figure 4:
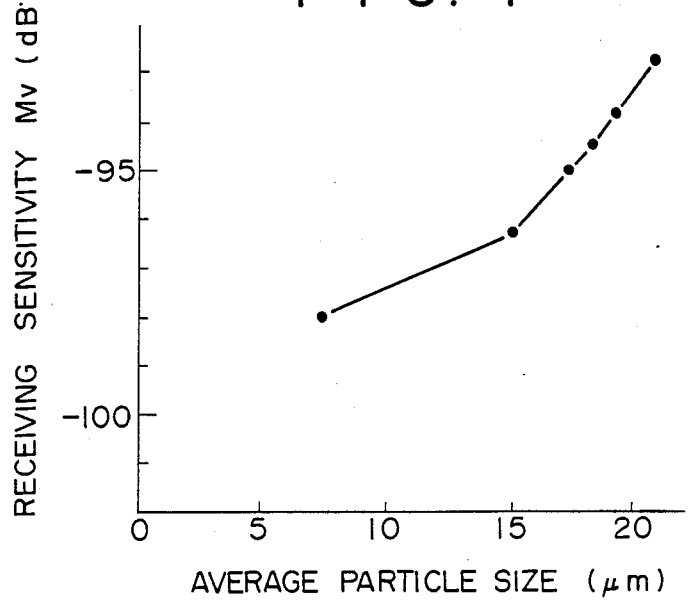

From the results shown in FIGS. 2-4, it is appreciated that the piezoelectric constants $d_h$ and $g_h$ are increased with the increase of the excess amount of PbO (average particle size). As will be seen from FIG. 5, however, the greater the excess amount of PbO (average particle size), the larger becomes the dielectric loss tan δ. Thus, a higher excess amount of PbO (average particle size) is advantageous because of better piezoelectric constants $d_h$ and $g_h$ but is disadvantageous from the standpoint of dielectric loss tan δ. That is, if the excess amoung PbO (average particle size) exceeds a certain value, then the resulting piezoelectric material becomes unsuited in practical use. The figure of merit $(d_h+g_h)/\tan\delta$ is as shown in FIG. 6 from which it will be noted that the figure of merit is maximum at an excess amount of PbO of 1.0 wt % (average particle size of 15 μm) but becomes lowered when the excess amount of PbO exceeds 3.0 wt % (average particle size of 18 μm). An excess amount of PbO above 5.0 wt % fails to give a piezoelectric material suitable for practical use. However, as poor dielectric loss tan δ can be compensated by controlling a wave receiving circuit, piezoelectric ceramic powder having an excess amount of PbO of above 5.0 wt % can be used for the purpose of the present invention.

Thus, from the results shown in FIGS. 2-6, it will be appreciated that the piezoelectric composites containing piezoelectric ceramic powder of the formula $Pb_{1+x}TiO_{3+x}(x>0)$, especially of the formula $Pb_{1+x}TiO_{3+x}(0.0068 \leq x \leq 0.07)$ have an improved physical properties as compared with the control. Therefore, the piezoelectric composites of the present invention are very suited for use in underwater transducers and hydrophones.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A piezoelectric composite material comprising:
   an elastic organic matrix and piezoelectric ceramic powder having the chemical formula:

$$Pb_{1+x}TiO_{3+x}$$

where x is a number between 0.0068 and 0.07, and wherein said piezoelectric composition is present in an amount of from about 40 to 80% by volume.

2. A piezoelectric composite material according to claim 1, wherein the content of said piezoelectric ceramic powder in said composite material is 40 to 80% by volume.

3. A piezoelectric underwater transducer comprising a piezoelectric element formed of the piezoelectric composite material according to claim 1.

4. A piezoelectric composite material comprising:
   a piezoelectric ceramic powder having the chemical formula:

$$Pb_{1+x}TiO_{3+x}$$

where x is a number between 0.0068 and 0.07, and wherein said piezoelectric composition is present in an amount of from about 40 to 80% by volume; and
   an organic matrix including synthetic rubber, said piezoelectric material being dispersed in said organic matrix.

5. The piezoelectric composite material of claim 6 wherein said synthetic rubber is polychloroprene rubber.

* * * * *